United States Patent [19]

Fisher et al.

[11] Patent Number: 4,754,315

[45] Date of Patent: Jun. 28, 1988

[54] BIPOLAR SEMICONDUCTOR DEVICES WITH IMPLANTED RECOMBINATION REGION

[75] Inventors: Carole A. Fisher, Horley; David H. Paxman, Redhill; Reginald C. Oldfield, Caterham, all of England

[73] Assignee: U.S. Philips Corporation, New York, N.Y.

[21] Appl. No.: 825,846

[22] Filed: Feb. 4, 1986

[30] Foreign Application Priority Data

Feb. 20, 1985 [GB] United Kingdom ............... 8504388

[51] Int. Cl.$^4$ .................... H01L 29/72; H01L 29/74; H01L 29/06; H01L 29/167
[52] U.S. Cl. ........................................ 357/64; 357/34; 357/36; 357/38; 357/55
[58] Field of Search .................. 357/64, 38, 36, 34, 357/55

[56] References Cited

U.S. PATENT DOCUMENTS

| | | | |
|---|---|---|---|
| 3,421,057 | 1/1969 | Bilous et al. | 357/64 |
| 3,821,784 | 6/1974 | Heald et al. | 357/64 |
| 4,035,670 | 7/1977 | Roman | 357/64 |
| 4,559,551 | 12/1985 | Nakagawa | 357/64 |

FOREIGN PATENT DOCUMENTS 56-78159  6/1981  Japan ..................................... 357/64

Primary Examiner—Martin H. Edlow
Assistant Examiner—D. Featherstone
Attorney, Agent, or Firm—Robert T. Mayer; Steven R. Biren

[57] ABSTRACT

A bipolar semiconductor device with interdigitated emitter and base regions has a sub-region of the base, which has a shorter carrier recombination time than the major part of the base region due to the presence of argon ion implantation induced carrier recombination centers. The sub-region of the base is located centrally with respect to the emitter region to intercept the transient current lines during device turn-off and so to promote collapse of the transient current and the avoidance of second breakdown of the device. The centrally located sub-region of the base is remote from the emitter region edges to collector region current flow when the device is on. The ions may be implanted at energies between 50 keV and 3 MeV and at doses between $10^{11}$ ions cm$^{-2}$ and $10^{14}$ ions cm$^{-2}$. The implanatation mask may be provided by photolithographically processed resist having a thickness between 0.5 μm and 4 μm dependant on the ion implantation energy. The depth of the sub region and the concentration of recombination centers within the sub-region may be varied by altering the implantation conditions to tailor the effect of the sub-region to the likelihood of the onset of second breakdown at any part of a device structure. The invention is particularly of use in transistors, and in thyristors.

8 Claims, 4 Drawing Sheets

BIPOLAR SEMICONDUCTOR DEVICES WITH IMPLANTED RECOMBINATION REGION

BACKGROUND OF THE INVENTION

The present invention relates to bipolar semiconductor devices, particularly but not exclusively where a bipolar semiconductor device is required to switch a high power load at high speed, having a semiconductor body, a first region of that body forming an emitter region, a second region of that body forming a base region and means for promoting the recombination of carriers in the base region of the device, and further relates to a method of manufacturing such a semiconductor device.

It is known that the operation of bipolar semiconductor devices, such as power transistors, is impeded by the occurrence of a phenomenon known as 'second breakdown'. This phenomemon is connected with a transient flow of current during the turn-off period of the transistor through a part of the transistor structure which is located centrally with respect to the emitter region and which may extend through the base region and the collector region of the transistor. Second breakdown occurs when local concentrations of the transient current occur and local heating creates hot spots which generate carriers by thermal means. Thermal runaway then occurs which eventually leads to the destruction of the transistor.

Control of the transient current may be exercised by providing carrier recombination centers in the base region and the collector region of the transistor. Carrier recombination centers may be provided by diffusing gold or platinum metal atoms into the base region and collector region of the transistor. The deep level carrier recombination centers so produced reduce the lifetime of carriers in the said regions by an amount dependent on the concentration of the gold or platinum atoms. Unfortunately, both gold and platinum diffuse rapidly in silicon, so the carrier recombination centers are distributed throughout the base region and collector region and although effective in combatting second breakdown, the presence of the carrier recombination centers impedes the flow of current from the active emitter region edges to the collector region when the transistor is on.

In addition to impeding the flow of current the presence of the metal atoms may cause excess leakage to occur at the boundary between doped regions of semiconductor devices. The excess leakage is caused by the precipitation of the metal atoms at these boundaries.

The problems described above inherent in the use of gold or platinum or other metal atoms, for example silver and copper, to provide deep level carrier recombination centers are recognized in U.K. Patent Specification No. 1511012 (General Electric Company). To overcome these problems the semiconductor device structure disclosed is one in which carrier recombination centers, provided by metal atoms, are confined in columnar arrays within the device structure. Each column is formed of a region of recrystallized material extending perpendicularly into the body of the semiconductor from a major surface and intersects a p-n junction at a part of the p-n junction which lies parallel to the major surface of the body. Each recrystallized region extends through at least one layer of a first conductivity type of the structure and extends at least part way through an adjacent layer of a second conductivity type of the structure.

A bipolar semiconductor device according to the invention of U.K. Pat. No. 1511012 thus has a semiconductor body with a first region of that body forming an emitter region and a second region of that body forming a base region. The part of the emitter region-base region p-n junction which lies parallel to a major surface of the body is substantially that part of the junction between the edges of the emitter region which are active when the device is on. The active zone of the base region lies substantially beneath the part of the emitter region-base region junction which is parallel to the major surface of the semiconductor body. The higher concentration of carrier recombination centers is within the active zone of the base region and extends through the emitter region and at least part way through the adjacent base region.

The columnar array is provided by further processing a semiconductor body which has been processed in accordance with well-known techniques to provide within the semiconductor body a finished device structure having regions of a first and a second opposite conductivity type and p-n junctions between the regions lying substantially parallel to the major surfaces of the semiconductor body.

The further processing includes masking a major surface with an acid-resistant material, preferably $SiO_2$, deposited by thermal oxidation or chemical vapour deposition, and then providing a photoresist mask over the acid resistant mask. The photoresist mask is then exposed and developed to form a mask through which the $SiO_2$ is etched with buffered HF to give an array of holes through the $SiO_2$ of not more than 10 micrometer ($\mu$m) diameter not more than 15 $\mu$m apart. After removal of the remaining photoresist, the surface of the semiconductor body is etched, using the previously-etched $SiO_2$ layer as a mask, to form depressions in the surface. After a post-etch rinse and dry, the metal which is to provide the recombination centers is evaporated onto the remaining $SiO_2$ layer and into the depressions in an evaporation chamber at a pressure of not more than $5\times10^{-5}$torr. A thermal migration process at a temp between 400° and 1400° C. with a temperature gradient of 50° C./cm was then used to drive droplets formed of the metal evaporated into the depressions to a required depth within the structure, or through the full thickness of the structure. Where the droplet was only driven to a required depth, for example, part way through the base region of the device, a reverse thermal migration was used to drive the droplet back to its starting point at the surface depression. The major surface at which the droplet resided after thermal migration was then ground to remove the droplet and etched to remove the effect of grinding. If this major surface was other than the major surface from which the migration of the droplet commenced both major surfaces of the semiconductor body were ground and etched to leave them ready for the deposition of electrodes and other processing required to complete the semiconductor device.

SUMMARY OF THE INVENTION

An object of the present invention is to provide a semiconductor device in which the occurrence of second breakdown is reduced by introducing carrier recombination centers into the base region of the device and to provide a simpler method for the introduction of these centers into the base region.

According to a first aspect of the present invention there is provided a bipolar semiconductor device, having a semiconductor body, a first region of that body forming an emitter region having edges active when the device is on, a second region of that body forming a base region having an active zone and a remaining part, the active zone being substantially beneath the emitter region and substantially between the emitter region active edges, and having a greater number of carrier recombination centers than the remaining part of the base region, the carrier recombination centers being located within a sub-region of the active zone, characterized in that, the recombination centers in the sub-region are provided by implanted ions and in that the sub-region is thinner than the active zone of the base region, is remote from the emitter region active edges and is located centrally with respect to the emitter region such that the recombination centers in the sub-region can promote recombination of carriers within the active zone substantially only during device turn-off.

With most device geometries the transient current flowing through the device during the turn-off period is found to be restricted to a part of the base region and collector region located beneath the center of the emitter region. The presence of the sub-region of the base region promotes carrier recombinations in the immediate vicinity of the sub-region of the base region and a carrier concentration gradient with the rest of the base region is formed. Carrier diffusion down the concentration gradient to the sub-region of the base region withdraws carriers from the base region promoting the collapse of the transient current. Under certain operating conditions, for example when switching high power loads, the junction between the base region and the collector region may be overwhelmed by the concentration of carriers in the parts of the base region and the collector region through which the transient current flows. As a result, the effect of the carrier concentration gradient established by the sub-region of the base region during turn-off of the device may also withdraw carriers from the part of the collector region of the device through which the transient current flow, provided the carriers have a sufficiently long mean free path.

Preferably the bipolar semiconductor device is a transistor or a thyristor.

The location of the sub-region of the base region centrally with respect to the emitter region and hence remote from the active edges of the emitter region when the device is on ensures that the sub-region of the base region cannot impede the flow of current from the active emitter region edges to the collector region of the device.

The sub-region of the base may extend parallel to the whole length of the emitter region. This allows control of the transient current to be exercised throughout the length of the active zone of the base region, leading to a reduced possibility of the occurrence of second breakdown of the device. The sub-region is thinner than the active zone of the base region and thus may lie wholly within the base region or be bounded by a surface of the base region. The position and shape of the sub-region within the active zone may thus be varied during manufacture to optimize the control the carrier recombination centers exercise on the transient current.

The emitter region of a bipolar device in accordance with the first aspect of the invention may be divided into sub-regions of which adjacent pairs are connected together by a common emitter electrode. With such an emitter region the sub-region of the base region is located in the base region between the emitter sub-regions connected by the common emitter electrode. The sub-region may extend from the surface of the semiconductor device into the base region. This may be conveniently achieved by ion implantation into the surface of the semiconductor body either before or after the provision of the emitter region in the surface of the body.

The adjacent emitter sub-regions connected by the common emitter electrode may be separated by a channel in the surface of the semiconductor body. The sub-region of the base region is located in the base region at the bottom of the channel, and may extend from the surface of the semiconductor body into the base region. The channel in the surface of the body reduces the number of recombination centers within the active zone which are additional to those introduced into the base sub-region. The recombination centers in the sub-region may conveniently be introduced by ion implantation into the bottom of the channel after the provision of the emitter region in the surface of the body.

The implanted ions may be ions of an inert gas, preferably ions of the inert gas argon. Argon ions, when implanted into a silicon slice at a concentration corresponding to a dose of $10^{14}$ cm$^{-2}$ give a carrier recombination time approximately ten thousand times shorter than in the silicon slice before implantation. At a dose of $10^{11}$ cm$^{-2}$, the carrier recombination time is approximately five times shorter than in the silicon slice before implantation. The implanted argon ions may be located at a depth corresponding to an implantation energy in the range 50 keV to 3 MeV.

The energy level associated with the argon implant which provides the carrier recombination effect is at approximately 0.5 eV below the conduction band in silicon.

According to a second aspect of the present invention there is provided a method of manufacturing a semiconductor device according to a first aspect of the invention which method includes the steps of providing a semiconductor body having at least part of a second region of the body which is to form a base region of the device extending to a surface of the body, applying a layer of a radiation sensitive resist to the surface of the body, lithographically forming the resist layer, by exposure of the resist layer to patterned radiation to which it is sensitive and subsequent developing, to give a resist mask in a pattern corresponding to a desired pattern of the sub-region of the base region at the surface of the semiconductor body, providing the recombination centers within the sub-region and E removing the remaining lithographically formed resist characterized in that in the fourth step the recombination centers are provided by implanted ions, in that the implantation is effected at an ion energy sufficient to implant ions at least to a depth corresponding to a desired thickness of the sub-region, and in that said ion energy is insufficient for ions to penetrate the resist mask on the surface of the semiconductor body.

The sub-region position at the surface of the semiconductor body may thus be defined by a mask formed of a resist layer and the thickness of the sub-region may be defined by the depth to which the ions are implanted. The processing of a resist layer to form a mask and ion implantation are widely used techniques in the manufacture of semiconductor devices. In the method in accordance with the second aspect of the invention they give, in combination, a particularly convenient and effective way of introducing the recombination centers where required in the semiconductor body.

A part of the second region of the body may extend to the surface at a channel in the surface of the body, and ions may be implanted into the body at the bottom of the channel. The channel may be provided in the surface by anisotropic etching.

A method in accordance with the invention may include the further step of providing a first region of the semiconductor body which is to form an emitter region of the device adjacent a surface of the device and applying and lithographically forming the resist layer over said surface. The ions may then be implanted at an energy sufficient to penetrate the first region to define the thickness of the sub-region of the base beneath the emitter region. The implantation damage due to the passage of the ions through the first region may be effective in dividing the emitter region into sub-regions, at the same time as the sub-region of the base is provided in the second region of the semiconductor body.

The ions, which may be ions of an inert gas, preferably argon, may be implanted at an energy between 50 keV and 3 MeV, at which energies the range of argon ions in silicon are 0.05 $\mu$m and 2.35 $\mu$m respectively. The ion dose may vary in accordance with the required concentration of carrier recombination centers in the sub-region, typically a dose between $10^{11}$ ions cm$^{-2}$ and $10^{14}$ ion cm$^{-2}$ may be used. By varying implantation energy and dose the thickness of the sub-region may be varied according to the requirements not only of a particular device, but also of the variation in turn-off characteristics within a device. These turn-off characteristics may vary within a device, for example because the emitter regions are of finite length. The concentration of carriers at a particular depth in the sub-region may also be varied to conform with the requirements of the control to be exercised on the transient current during device turn-off. The ion implantation may be used to provide an implant concentration which is higher than the solid solubility of the implanted atom in the semiconductor body.

It is particularly convenient to use argon ions as the source of the recombination centers in the sub-region of the base region as they have a low mobility in silicon at the elevated temperature used in device processing, ensuring that the implant remains located centrally with respect to the emitter region and remote from the edges of the emitter region.

The resist layer may be applied in a thickness between 0.5 $\mu$m and 5 $\mu$m. Such a resist thickness is used widely in semiconductor device processing, may be lithographically processed by known techniques and is sufficiently thick to prevent the penetration of ions at an energy between 50 keV and 3 MeV respectively.

BRIEF DESCRIPTION OF THE DRAWING

Embodiments of the invention will now be described, by way of example, with reference to the accompanying drawings, in which.

For the sake of clarity the drawings are not to scale and features of a similar description have been given the same reference number in each of the figures.

DESCRIPTION OF THE PREFERRED EMBODIMENTS

Figure 2:
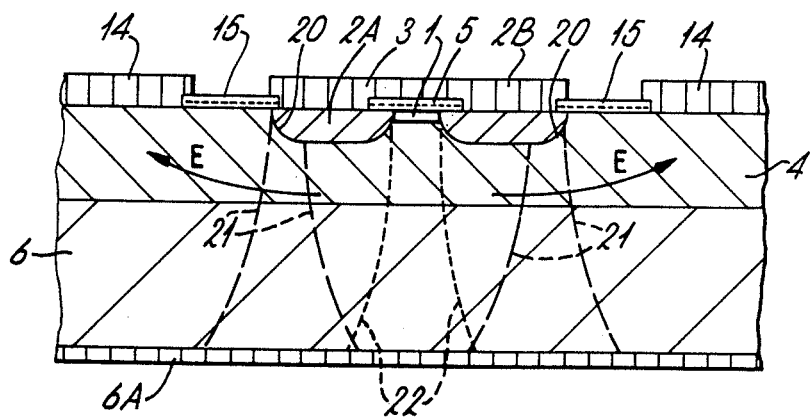
Figure 3:
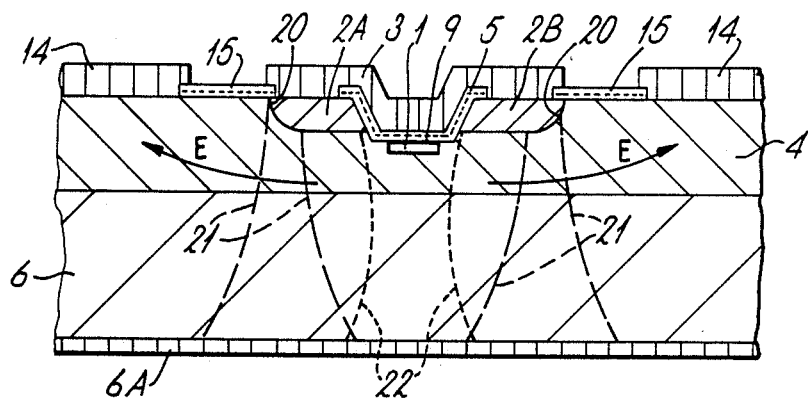
Figure 4:
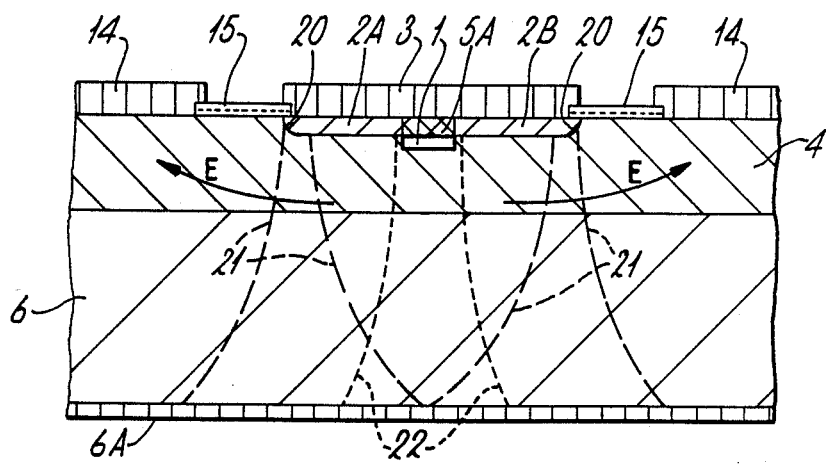

Turning first to the similar features of FIGS. 1, 2, 3 and 4, all the embodiments have the well known structure of interdigitated emitter and base regions and all the figures show a section at right angles to one finger of the emitter region and the surrounding base region which are interdigitated. The emitter region may be of solid finger construction as shown by the emitter region 2 of FIG. 1 or of hollow finger construction as shown by the adjacent pair of emitter sub-regions 2A, 2B of FIGS. 2, 3 and 4. The emitter electrode 3 connects the adjacent pair of emitter sub-regions as a common emitter electrode in FIGS. 2, 3 and 4 and is isolated from the base region 4 by an oxide layer 5 (FIGS. 2 and 3) or an implantation damaged region 5A which divides the emitter into the sub-regions 2A, 2B (FIG. 4). Connection to the collector region 6 is made via a collector electrode 6A. Further insulating oxide layers 15 are provided between the base and emitter electrodes.

Figure 1:
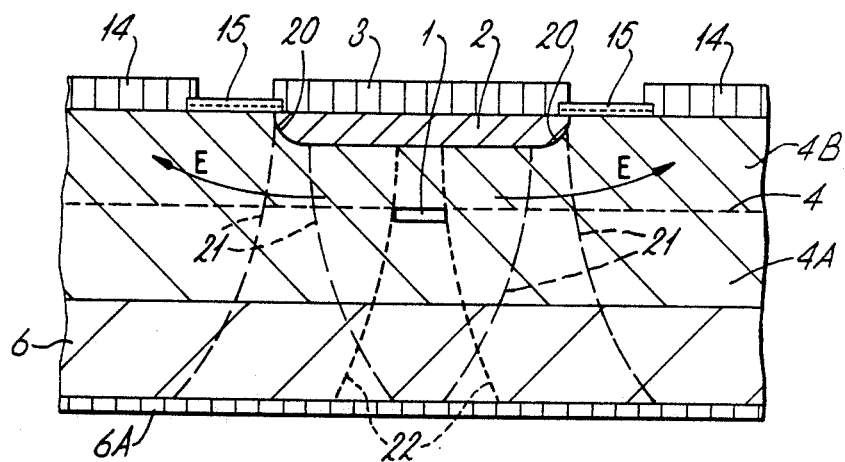
FIGS. 1, 2, 3 and 4 show schematically in section a first, second, third and fourth embodiment respectively of a part of a bipolar transistor in accordance with the invention.

The base region 4 contains a base sub-region 1 which extends parallel to and is located centrally with respect to the emitter region 2 of FIG. 1 or the emitter sub-regions 2A, 2B having the common emitter electrode 3 of FIGS. 2, 3 and 4. The base sub-region has a shorter recombination time than the major part of the base region due to the provision of carrier recombination centers within the sub-region by implanted ions. The embodiments have the base sub-region at various depths within the base region. Well known device processing steps may be used to provide the base sub-region in the position shown in each embodiment. These processing steps will be described below with reference to FIGS. 5A-D, 6A-C, 7A-C and 8A-B.

The mode of action of the base sub-region in opposing the onset of second breakdown by control of the transient current is similar for all the embodiments shown in FIGS. 1 to 4. When the transistor is on, the active edges of the emitter region, or sub-regions, are the edges 20 closest to the base electrodes 14. The boundaries of the current path from the emitter region active edges to the collector electrode 6A are marked by dashed lines 21. When the transistor is turning off, the extraction of carriers from the base region by the base electrodes, in a direction indicated by arrows E, pinches the part of the base region through which a transient current can flow towards the center of the emitter region or sub-regions, with a consequential pinch effect on the current path in the collector, and the boundaries of this pinched current path are marked by dashed lines 22.

It will be seen that the base sub-region is placed within the current path which occurs during device turn-off and acts by causing carrier recombination to isolate the emitter region or sub-regions from the collector region thus opposing the onset of second breakdown by causing the transient current to collapse.

Figure 5A:
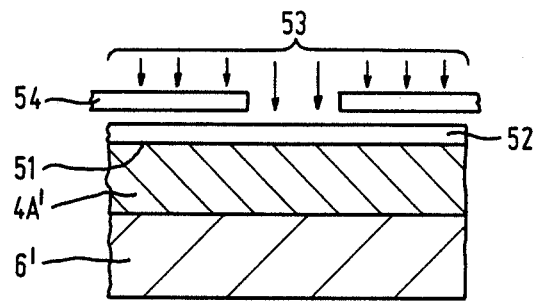
FIGS. 5A-C, 6A-B, 7A-C and 8A-B show schematically stages in a method of manufacturing a first, second, third and fourth embodiment respectively of a bipolar device in accordance with the invention.
Figure 5B:
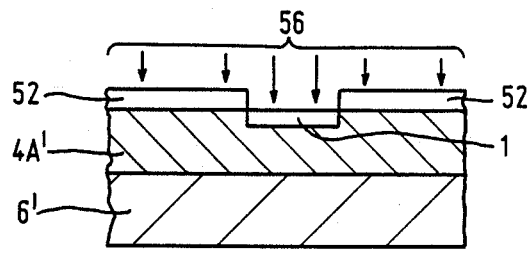
Figure 5C:
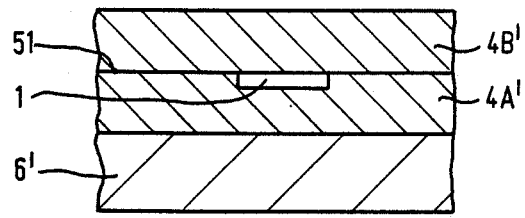

FIGS. 5A-C show schematically stages in a method of making a semiconductor device in accordance with the invention. In FIG. 5A, a region 6', which is to form the collector region 6, see FIG. 1, of the completed device, has deposited on it a first epitaxial layer 4A' which is to form part of the second region of the completed device. The layer 4A' has deposited on its surface 51 a 1 μm thickness of a negative working ultra-violet sensitive resist layer 52, which is shown in the figure while being exposed to ultraviolet radiation 53 patterned by mask 54. The exposure to ultraviolet radiation 53 and subsequent lithographic processing give a pattern 55 in the resist layer corresponding to the desired pattern of the sub-region at the surface 51 of the semiconductor body as shown in FIG. 5B. Implantation of argon ions from ion beam 56 at an energy of 200 keV provides recombination centers in the sub-region 1. The resist layer 52 thickness of 1 μm is sufficient to prevent the implantation of ions into the layer 4A' except where required for the sub-region 1. The sub-region 1 thickness, defined by energy of the implanted ions, is approximately 0.28 μm. The remaining resist layer is then removed and a second epitaxial layer 4B' is deposited, for example by chemical vapor deposition, on the surface 51 of the first epitaxial layer 4A' as shown in FIG. 5C. The sub-region 1 is thus buried between the pair 4A', 4B' of superimposed layers. Further known semiconductor device manufacturing steps, including the provision of an emitter region 2 and emitter 3, base 14 and collector 6A electrodes provides a semiconductor device in accordance with the invention, as shown in FIG. 1.

Figure 6A:
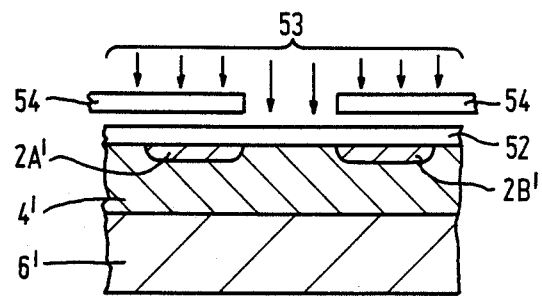
Figure 6B:
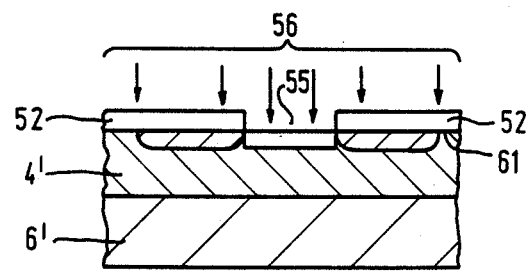

In FIG. 6A, a semiconductor body 60 has a region 6' of a first conductivity type which is to form a collector region 6, see FIG. 2, of a transistor. Superimposed on region 6' is a region 4', of a second conductivity type, which is to form a base region 4, see FIG. 2 of the transistor. The region 4', contains two sub-regions 2A' and 2B' of the first conductivity type which are to form the sub-regions 2A and 2B of the emitter region of the transistor shown in FIG. 2. A 1 μm thick layer 52 of negative working resist is shown being exposed by ultra violet radiation 53 patterned by mask 54. Subsequent lithographic processing gives a pattern 55 in the resist layer corresponding to the desired pattern of the sub-region 1 of the base region 4, see FIG. 2, at the surface 61 of the semiconductor body 60, as in FIG. 6B. Implantation of argon ions from the ion beam 56 at an energy of 200 keV provides recombination centres for the sub-region 1. The thickness of the resist layer is sufficient to prevent implantation of ions into the sub-regions 2A' and 2B' or the region 4' except where required for the sub-region 1. The thickness of sub-region 1, defined by the energy of the implanted ions is approximately 0.28 μm.

The device may be completed by known manufacturing steps and the sub-region 1 is thus located centrally with respect to the emitter region, to give a device as shown in FIG. 2.

Figure 7A:
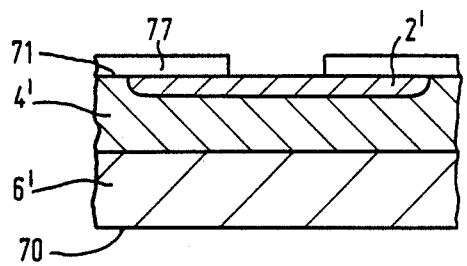
Figure 7B:
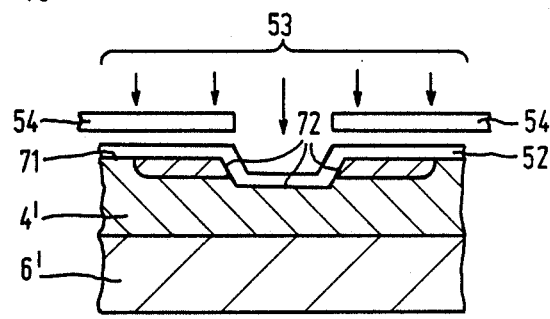
Figure 7C:
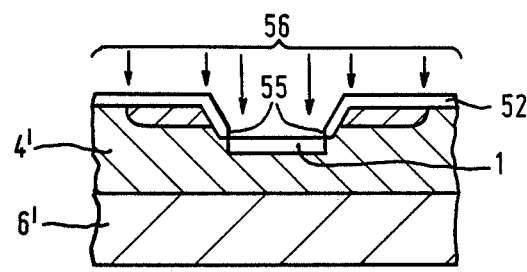

In FIG. 7A, a semiconductor body 70 is shown in which are provided the regions 6' and 4' which are to form the collector region 6 and base region 4 of the completed device shown in FIG. 3. A region 2', from which the emitter sub-regions 2A and 2B are formed in the completed device shown in FIG. 3, is etched anisotropically through a resist mask 77 to form a channel 72 in the surface 71 of the semiconductor body as shown in FIG. 7B. FIG. 7B also shows a layer of negative working resist 52 of, for example, 0.5 μm thickness applied to the surface 71 of the body and to the sides and bottom of the channel 72. The resist is exposed to ultraviolet radiation 53 patterned by mask 54 and lithographically processed to give a pattern 55 as shown in FIG. 7D in the resist layer at the bottom of the channel corresponding to the desired pattern of the sub-region 1 as shown in FIG. 3.

Implantation of argon ions, at an energy of, for example 50 keV, provides recombination centers for the sub-region 1. The 0.5 μm thickness of resist is sufficient to prevent implantation of ions into the sub-regions 2A' and 2B' and the region 4' except where required for the sub-region. The resist layer 52 may then be removed and the device manufacture completed by known processing steps to provide a device in accordance with the invention as shown in FIG. 3.

Figure 8A:
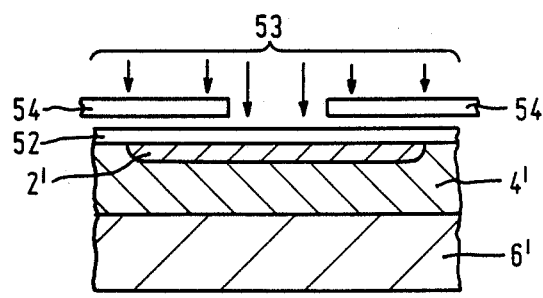
Figure 8B:
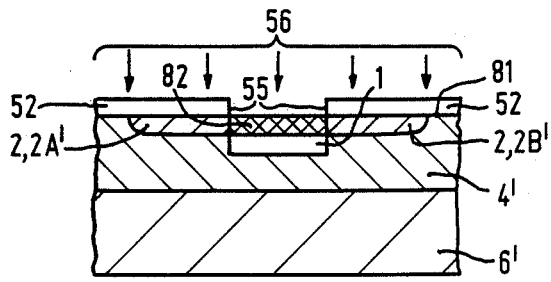

In FIG. 8A a semiconductor body 80 is shown in which are provided regions 6', 4' and 2' from which respectively will be formed the collector region 6, base region 4 and emitter sub-regions 2A and 2B of the transistor device structure in accordance with the invention shown in FIG. 4. The surface 81 of the body has on it a resist layer 52 of for example 4 μm thickness. This resist layer is shown in FIG. 8A being exposed to ultraviolet radiation 53 patterned by a mask 54. After subsequent lithographic processing the developed resist forms a pattern 55 as shown in FIG. 8B of a pattern corresponding to the desired pattern of the sub-region 1 at the surface 81 of the body. The implantation of ions at an energy of for example 2 MeV, provides recombination centers for the sub-region 1 and provides an implantation damage region 82 which divides the region 2' into sub-regions 2A' and 2B'. These sub-regions 2A' and 2B' will form the emitter sub-regions 2A and 2B of the completed device shown in FIG. 4. The depth of ion implantation from the surface 81 is approximately 2 μm at an energy of 2 MeV, an energy of 3 MeV would increase this depth to approximately 2.5 μm. The thickness of the sub-region is therefore dependent on both the implanted ion energy and the thickness of the region 2'. The manufacture of the device may then be completed, after removal of the resist, by known manufacturing steps to provide a device in accordance with the invention as shown in FIG. 4. In such a method of manufacture the thickness of the emitter sub-regions is necessarily limited by the step of implanting the ions in the sub-region through the emitter region. For this reason this method may be limited to the manufacture of devices having shallow emitter regions, between for example 0.5 and 2 μm thickness.

All the embodiments described have been concerned with transistors and transistor operation. The emitter region, base region and base sub-region structures described are equally applicable mutatis mutandis to the cathode region, gate region and gate sub-region of thyristors and other gate-controlled four layer devices.

Further, no indication has been given of the carrier type of the emitter, base and collector regions of the embodiments described as transistors embodying the invention may equally well be of n-p-n or p-n-p construction.

We claim:

1. A bipolar semiconductor device comprising a semiconductor body, a first region of said body forming an emitter region having a peripheral portion, a second region of said body forming a base region having a first zone and a remaining part, the first zone being substantially beneath the emitter region and having a greater number of carrier recombination centers than that of the remaining part of the base region, and a sub-region of the first zone, the carrier recombination centers being located in said sub-region, and means for having the recombination centers in the sub-region promote recombination of carriers within the active zone in operation substantially only during device turn-off, said means comprising said sub-region being thinner than the first zone of the base region, remote from the peripheral portion of the emitter region and located only centrally with respect to the emitter region.

2. A bipolar semiconductor device as claimed in claim 1 the emitter region is divided into emitter sub-regions in a surface of the semiconductor body, at least one adjacent pair of the emitter sub-regions is connected together by a common emitter electrode, and the emitter electrode is isolated from the base region portions which extends to the surface of the semiconductor body between the emitter sub-regions.

3. A bipolar semiconductor device as claimed in claim 1 or claim 2, wherein the base sub-region is buried in said base region and spaced apart from said emitter region.

4. A bipolar semiconductor device as claimed in claim 2, wherein the sub-region of the base region is within the base region between the emitter sub-regions and extends from the surface of the semiconductor body into the base region.

5. A bipolar semiconductor device as claimed in claim 2, wherein each pair of emitter sub-regions connected by a common emitter electrode is separated by a channel in the surface of the semiconductor body.

6. A bipolar semiconductor device as claimed in claim 5, wherein the sub-region of the base region extends into the base region from the bottom of the channel in the surface of the semiconductor body.

7. A bipolar semiconductor device as claimed in claim 1, wherein the emitter region is a shallow emitter region and the sub-region of the base region is provided beneath the emitter region.

8. A bipolar semiconductor device as claimed in claim 7, wherein the emitter region is divided into sub-regions which are connected together by common emitter electrode.

* * * * *